(12) United States Patent
Park et al.

(10) Patent No.: US 8,772,150 B2
(45) Date of Patent: Jul. 8, 2014

(54) METHOD OF FORMING P-TYPE ZNO FILM

(71) Applicant: Gwangju Institute of Science and Technology, Gwangju (KR)

(72) Inventors: Seong Ju Park, Gwangju (KR); Yong Seok Choi, Gwangju (KR); Jang Won Kang, Gwangju (KR)

(73) Assignee: Gwangju Institute of Science and Technology, Buk-Gu, Gwangju (KR)

( * ) Notice: Subject to any disclaimer, the term of this patent is extended or adjusted under 35 U.S.C. 154(b) by 61 days.

(21) Appl. No.: 13/712,127

(22) Filed: Dec. 12, 2012

(65) Prior Publication Data
US 2013/0256654 A1    Oct. 3, 2013

(30) Foreign Application Priority Data
Mar. 28, 2012 (KR) .......... 10-2012-0031636

(51) Int. Cl.
  *H01L 21/28*  (2006.01)
  *H01L 21/3205*  (2006.01)
(52) U.S. Cl.
  USPC .......................... 438/603; 438/608
(58) Field of Classification Search
  CPC ............ H01L 21/02507; H01L 21/02472; H01L 21/02483; H01L 21/02554; H01L 21/02565; H01L 21/02579; H01L 21/0262; H01L 2251/5361; H01L 51/5262
  USPC ..................... 438/240, 603, 608
  See application file for complete search history.

*Primary Examiner* — Michelle Mandala
(74) *Attorney, Agent, or Firm* — Nath, Goldberg & Meyer; Joshua B. Goldberg

(57) ABSTRACT

Disclosed herein is a method of forming a p-type zinc oxide thin film. A zinc oxide layer and an antimony oxide layer are alternately stacked one above another on a substrate, forming a superlattice layer. The superlattice layer is modified into a p-type zinc oxide thin film by annealing. Upon annealing, zinc atoms of the zinc oxide layer are diffused into the antimony oxide layer and antimony atoms of the antimony oxide layer are diffused into the zinc oxide layer.

8 Claims, 5 Drawing Sheets

METHOD OF FORMING P-TYPE ZNO FILM

CROSS-REFERENCE TO RELATED APPLICATION

This application claims priority to Korean Patent Application No. 10-2012-0031636 filed on Mar. 28, 2012 and all the benefits accruing therefrom under 35 U.S.C. §119, the contents of which are incorporated by reference in their entirety.

BACKGROUND

1. Technical Field

The present invention relates to a method of forming a zinc oxide film, and more particularly, to a method of forming a p-type zinc oxide film containing dopants.

2. Description of the Related Art

Zinc oxide is a Group II-VI semiconductor having a hexagonal Wurzite crystalline structure, which is the same as those of GaN, ZnSe, ZnS, etc. The crystalline structure of zinc oxide has a degree of lattice mismatch of about 1.98% relative to gallium nitride that is a major material for light emitting diodes. Thus, ZnO has a high possibility of application to a heterogeneous stacking structure.

Also, zinc oxide has an optical band gap of about 3.37 eV, which is similar to the band gap of GaN amounting to 3.4 eV, so that it is available as a near-ultraviolet light source. Further, since zinc oxide also has relatively high defect-formation energy, it may have good properties if manufactured into optical devices. Furthermore, zinc oxide has a larger room-temperature exciton binding energy of 60 meV, which is about three times higher than those of GaN and ZnSe (24 and 19 meV). Thus, it can be expected that zinc oxide will provide highly efficient optical gain in exciton-based optoelectronic applications.

However, in order to apply zinc oxide to light emitting diodes and the like, deposition of a crystal thin film, implementation of a multiple quantum-well structure, and formation of a p-type semiconductor layer are important factors to be solved. Particularly in forming an existing p-type ZnO thin film, a source of zinc and a source of dopants are supplied at the same time, followed by annealing, thereby forming a p-type thin film. Particularly, the dopants include group V elements. The forming process may be metal organic chemical vapor deposition (MOCVD).

However, MOCVD causes poor crystallinity of zinc oxide and numerous defects in a crystal lattice. Moreover, dopant atoms are not uniformly distributed in the thin film, causing agglomeration or diffusion of the dopant atoms towards the surface of the thin film.

This is also due to a high escape rate of oxygen atoms in the crystal of ZnO. High diffusibility of oxygen intensifies crystal defects so that dopant atoms to be combined with oxygen are not uniformly distributed in the crystal structure.

Particularly, when the p-type ZnO thin film is formed using antimony as a dopant, a conventional MOCVD process is used.

FIG. 1 shows an image of a p-type zinc oxide thin film formed by a conventional MOCVD process.

Referring to FIG. 1, diethyl zinc (DEZn) and trimethyl antimony (TMSb) were used as precursors of zinc and antimony, respectively. In addition, a growing temperature is set to 600° C. while oxygen gas is supplied.

Antimony atoms are not crystallized due to low melting point, but can be easily evaporated. In addition, the interior of the film is agglomerated with ZnO and the outer surface of the film is formed of Sb-doped ZnO. This is caused by a phenomenon that antimony atoms are concentrated on the outer surface of the film due to diffusion of antimony. However, the p-type ZnO thin film having this structure has problems of insufficient carrier concentration and higher resistance. Thus, it is impossible to dope antimony in practice.

BRIEF SUMMARY

Therefore, the present invention is aimed at providing a method of forming a p-type zinc oxide thin film using a superlattice.

In accordance with one aspect of the present, a method of forming a p-type zinc oxide thin film includes: forming a superlattice layer in which a zinc oxide layer and an antimony oxide layer are alternately stacked; and annealing the superlattice layer to modify the superlattice layer into a p-type zinc oxide thin film.

According to the present invention, the superlattice layer is formed using the zinc oxide layer and the antimony oxide. The superlattice layer is formed into a p-type zinc oxide thin film through annealing. This structure is obtained by diffusion of zinc atoms and antimony atoms during annealing. Thus, antimony atoms are diffused towards zinc oxide layers, thereby preventing deterioration of characteristics of the p-type thin film.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1:
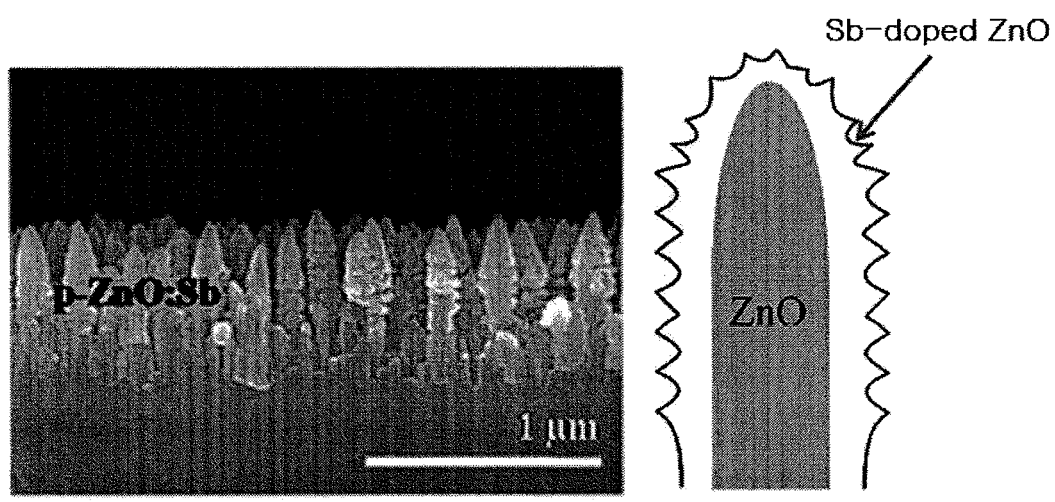
FIG. 1 is an image of a p-type zinc oxide thin film formed using MOCVD in the art.

Exemplary embodiments of the present invention will now be described in detail with reference to the accompanying drawings. However, it should be understood that the present invention is not limited to the following embodiments and may be embodied in different ways by those skilled in the art without departing from the scope of the present invention. Further, it should be understood that various modifications, substitutions, and equivalent embodiments may be made by those skilled in the art without departing from the spirit and scope of the present invention. The same components will be denoted by the same reference numerals throughout the drawings.

Unless otherwise defined herein, all terms including technical or scientific terms used herein have the same meanings as commonly understood by those skilled in the art to which the present invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein.

Next, exemplary embodiments of the present invention will be described in detail with reference to the accompanying drawings.

Figure 2:
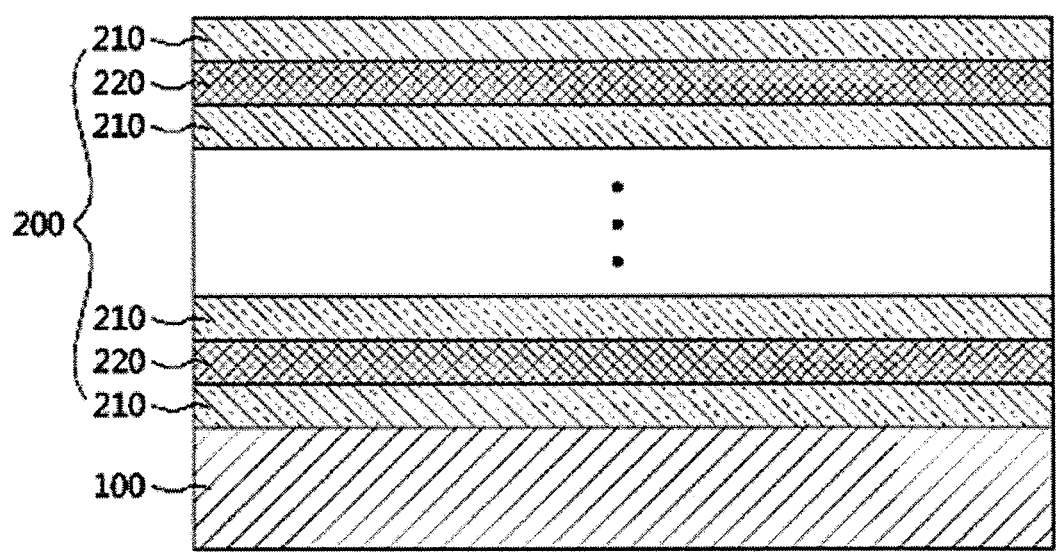
FIGS. 2 and 3 are cross-sectional views explaining a method of forming a p-type zinc oxide thin film according to one exemplary of the present invention.
Figure 3:
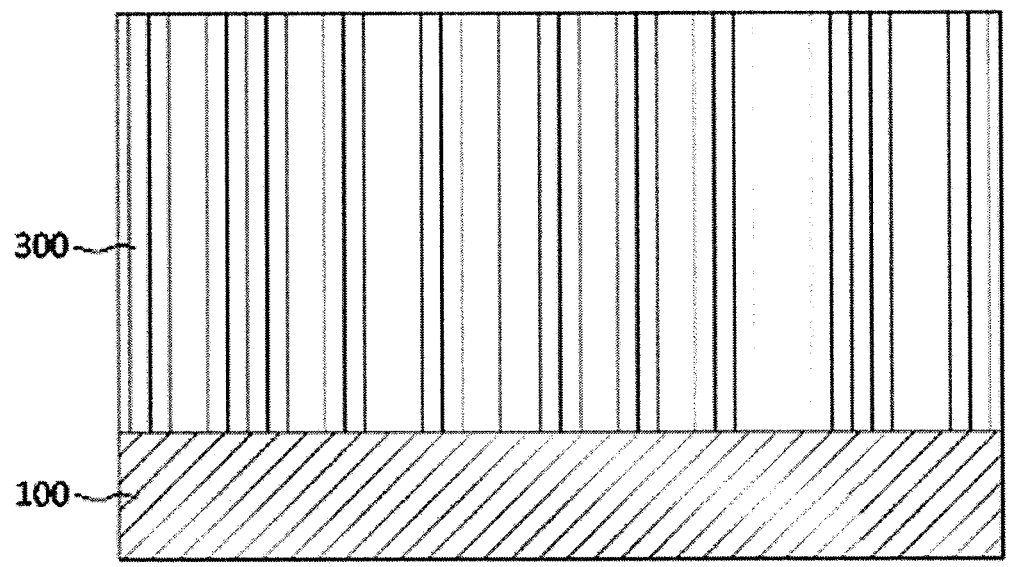

FIGS. 2 and 3 are cross-sectional views explaining a method of forming a p-type zinc oxide thin film according to one exemplary of the present invention.

Referring to FIG. 2, a superlattice layer 200 is formed on a substrate 100.

The substrate 100 may include sapphire, zinc oxide, quartz, glass, or gallium nitride. The substrate 100 is formed through preparation and cutting of an ingot. The substrate may be a physical substrate for inducing growth of a membrane, or otherwise, a different functional membrane formed on a specific substrate. For example, the functional membrane may be a multi-quantum well layer of a light emitting diode, an n-type semiconductor layer, or a zinc oxide film.

The superlattice layer is formed on the substrate 100 by MOCVD. The superlattice layer includes a zinc oxide (ZnO) layer 210 and an antimony oxide ($Sb_2O_3$) layer 220, which are alternately stacked.

To form the zinc oxide layer 210, a precursor of zinc and oxygen are supplied into a reaction chamber. The precursor of zinc may be DEZn, and a carrier gas may be Ar. By supplying the precursor of zinc and oxygen gas, the zinc oxide layer 210 is formed on the substrate 100. The ZnO layer may have a thickness ranging from 2 nm to 4 nm. If the thickness of the ZnO layer 210 is less than 2 nm, it is difficult to form a thin film, and to secure surface uniformity of the thin film. In addition, if the thickness of ZnO layer 210 exceeds 4 nm, antimony atoms cannot be uniformly distributed over the zinc oxide layer 210, even though antimony atoms are diffused during subsequent annealing.

The antimony oxide layer 220 is formed on the zinc oxide layer 210. The antimony oxide layer 220 is formed by MOCVD. A precursor of antimony may be TMSb, and a carrier gas may be Ar. The antimony oxide layer 220 is formed by supplying the precursor and oxygen. Antimony oxide has a melting point of 656° C., which is much lower than the melting point of zinc oxide, that is, 1975° C. Thus, the thickness of the antimony oxide layer 220 formed by MOCVD is less than that of the zinc oxide layer 210. That is, due to the relatively low melting point of antimony oxide, movement of the precursor is activated in the chamber, and a probability of precipitation or solidification of the precursor on the substrate 100 or the zinc oxide layer 210 is lowered.

Thus, the antimony oxide layer 220 may have a thickness ranging from 0.5 nm to 2 nm. If the thickness of the antimony oxide layer 220 is less than 0.5 nm, there is a problem of insufficient diffusion of antimony atoms. Further, if the thickness of the antimony oxide layer 220 is more than 2 nm, there is a problem in that considerable processing time is needed to obtain a proper thickness of the thin film.

The zinc oxide layer 210 and the antimony oxide layer 220 are alternately stacked one above another. For example, considering that the zinc oxide layer 210 and the antimony oxide layer 220 are a single grating pair, 50 to 70 grating pairs can be formed.

Further, the thickness of the zinc oxide layer 210 may be set to be greater than that of the antimony oxide layer 220.

Referring to FIG. 3, annealing is performed on the structure shown in FIG. 2.

The superlattice layer 200 is formed into a p-type zinc oxide thin film 300 through annealing. Annealing may be performed at a temperature of 250° C. to 550° C. for 30 seconds to 5 minutes. Annealing may be rapid thermal annealing.

Antimony atoms in the antimony oxide layer are diffused into the zinc oxide layer through annealing. Further, zinc atoms of the zinc oxide layer are diffused into the antimony oxide layer.

If the temperature of the annealing is less than 250° C., diffusion of antimony atoms and zinc atoms does not smoothly occur, causing local agglomeration of the antimony or zinc atoms. If the temperature of the annealing exceeds 550° C., n-type conductivity is obtained instead of p-type conductivity. This can be explained by active movement of oxygen at high temperatures, which leads to formation of oxygen vacancies and generation of electrons.

Further, if the heat temperature time is less than 30 seconds, diffusion of antimony and zinc atoms is not sufficient, so that p-type conductivity cannot be obtained. Further, if the heat temperature time is more than 5 minutes, p-type conductivity cannot be obtained due to the supply of excessive thermal energy.

The p-type zinc oxide thin film 300 is formed by inter-diffusion between zinc atoms of the zinc oxide layer and antimony atoms of the antimony oxide layer. This is because the thickness of the antimony oxide layer is relatively smaller than that of the zinc oxide layer, so that antimony atoms act as dopants.

As set forth above, in the method according to the present invention, the superlattice layer comprised of the zinc oxide layer and the antimony oxide layer is formed, and then subjected to annealing so as to diffuse zinc and antimony atoms. As a result, the antimony atoms can be activated as dopants. Thus, two kinds of layers having heterogeneous configurations before annealing are formed into a single thin film through diffusion. This means that the superlattice layer is formed into a p-type zinc oxide thin film. Of course, according to embodiments of the invention, the antimony oxide layer may have a higher pre-diffusion concentration of antimony atoms in a central portion thereof than that of zinc atoms in the central portion of the zinc oxide layer.

Example

Figure 4:
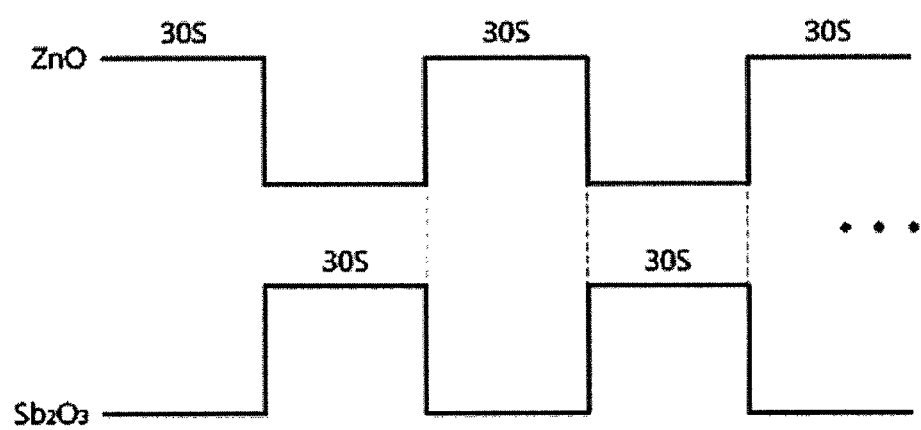
FIG. 4 is a timing diagram explaining growth of a zinc oxide layer and an antimony oxide layer formed in one example of the present invention.

A substrate was first loaded into MOCVD equipment. The substrate is a substrate which includes a zinc oxide thin film formed on a sapphire substrate. The zinc oxide film serves as a growth factor of a zinc oxide layer in the subsequent process. DEZn was used as a precursor of zinc, and Ar was used as a carrier gas. The flow rate of DEZn was set to 150 sccm. The flow rate of oxygen was set to 7500 sccm. TMSb was used as a precursor of antimony and supplied at a flow rate of 5470 nmol/min. In the chamber, the growth pressure was set to 50 Torr, and the growth temperature was set to 600° C. The superlattice layer was grown for 1 hour. FIG. 4 is a timing diagram explaining growth of a zinc oxide layer and an antimony oxide layer in one example of the present invention.

Referring to FIG. 4, a zinc oxide layer was initially formed for 30 seconds by supplying DEZn and oxygen into the chamber. While the zinc oxide layer was formed, supply of TMSb was interrupted. Thus, the formation of an antimony oxide layer was restricted. After 30 seconds elapsed, the supply of DEZn was interrupted, and TMSb and oxygen were supplied. As a result, an antimony oxide layer was formed on the zinc oxide layer. The supply of TMSb was carried out for 30 seconds. Then, a zinc oxide layer was formed on the antimony oxide layer for 30 seconds.

Considering that the zinc oxide layer and the antimony oxide layer, which were formed through the above process, form a single superlattice, superlattices form a 60-layered superlattice layer. Here, an uppermost layer of the superlattice layer may be a zinc oxide layer. The zinc oxide layer facilitates the formation of a p-type zinc oxide layer through diffusion of zinc and antimony atoms in the subsequent process.

A superlattice layer of about 700 nm thickness may be formed by the process as described above.

Table 1 shows the effects of annealing on the superlattice layer.

TABLE 1

| RTA Condition | Resistivity (ohm · cm) | Mobility (cm$^2$/V · s) | Carrier Concentration (/cm$^3$) |
|---|---|---|---|
| None | 257 | — | — |
| 300° C., 1 min, Nitrogen atmosphere | 20.7 | 0.158 | p-type, $4.77 \times 10^{18}$ |
| 500° C., 1 min, Nitrogen atmosphere | 10.2 | 0.085 | p-type, $8.22 \times 10^{18}$ |
| 600° C., 1 min, Nitrogen atmosphere | 0.918 | 3.31 | n-type, $2.05 \times 10^{18}$ |

Referring to Table 1, the non-annealed example showed high resistivity and indiscernible mobility and concentration of carriers. This means that the superlattice layer merely has a stacking structure in which a zinc oxide layer and an antimony oxide layer are simply repeatedly stacked one above another.

Further, when rapid thermal annealing (RTA) is carried out, it means that a specific type of electric conductivity is obtained by movement of antimony and zinc atoms. In Table 1, upon RTA, the annealing temperature was increased from room temperature to a target temperature for 3 to 4 seconds, and the target temperature was held under a nitrogen atmosphere for 1 minute. Then, the temperature was slowly decreased through air cooling.

The target temperature of annealing was set to 300° C., 500° C., and 600° C. When annealing was carried out at 600° C. that is higher than a desired range, n-type conductivity was obtained instead of p-type conductivity. It was believed that this result was obtained because a relatively high annealing temperature causes defects in the zinc oxide layer and oxygen is discharged from the zinc oxide layer or antimony oxide layer.

Figure 5:
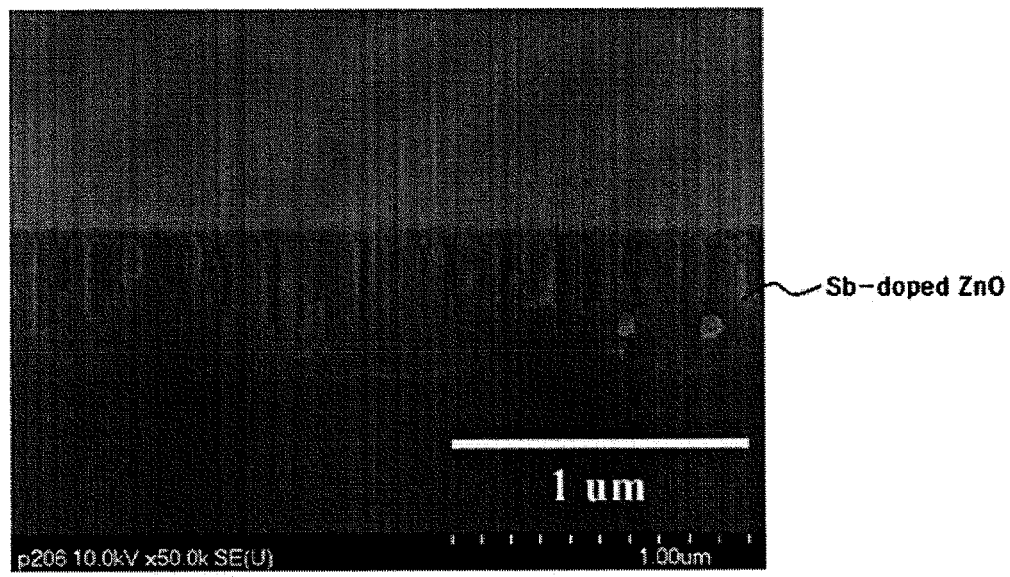
FIG. 5 is an image of a p-type zinc oxide layer prepared in one example of the present invention.

FIG. 5 is an image of a p-type zinc oxide layer prepared in one example of the present invention.

Referring to FIG. 5, the zinc oxide layer and the antimony oxide layer formed in the example were annealed at 500° C. for 1 minute under a nitrogen atmosphere.

A p-type zinc oxide thin film was formed on a sapphire substrate which includes a zinc oxide layer thereon. The zinc oxide layer becomes a bar or rod shape as it approaches an upper side thereof. It was believed that such configuration of the zinc oxide layer was obtained due to the processing temperature upon initially forming the zinc oxide layer and the antimony oxide layer.

According to the present invention, the superlattice layer consisting of zinc oxide layers and antimony oxide layers alternately stacked one above another is modified into a p-type zinc oxide thin film by annealing. In the process of annealing, zinc atoms and antimony atoms are diffused, and the antimony atoms serve as dopants, thereby forming the p-type zinc oxide thin film.

Although some exemplary embodiments have been described herein, it should be understood by those skilled in the art that these embodiments are given by way of illustration only, and that various modifications, variations and alterations can be made without departing from the spirit and scope of the present invention, as defined only by the following claims and equivalents thereof.

What is claimed is:

1. A method of forming a p-type zinc oxide thin film, comprising:
   forming a superlattice layer in which a zinc oxide layer and an antimony oxide layer are alternately stacked; and
   annealing the superlattice layer to modify the superlattice layer into a p-type zinc oxide thin film.

2. The method according to claim 1, wherein the zinc oxide layer has a thickness greater than that of the antimony oxide layer.

3. The method according to claim 2, wherein the thickness of the zinc oxide layer ranges from 2 nm to 4 nm.

4. The method according to claim 3, wherein the thickness of the antimony oxide layer ranges from 0.5 nm to 2 nm.

5. The method according to claim 1, wherein the annealing is carried out to allow zinc atoms of the zinc oxide layer to be diffused into the antimony oxide layer and to allow antimony atoms of the antimony oxide layer to be diffused into the zinc oxide layer.

6. The method according to claim 5, wherein the annealing is carried out at a temperature ranging from 250° C. to 550° C.

7. The method according to claim 6, wherein the annealing is carried out for 30 seconds to 5 minutes.

8. The method according to claim 1, wherein an uppermost layer of the superlattice layer is the zinc oxide layer.

* * * * *